(12) United States Patent
Hwang et al.

(10) Patent No.: US 9,490,395 B2
(45) Date of Patent: Nov. 8, 2016

(54) NANOSTRUCTURE SEMICONDUCTOR LIGHT-EMITTING DEVICE

(71) Applicant: SAMSUNG ELECTRONICS CO., LTD., Suwon-si, Gyeonggi-do (KR)

(72) Inventors: Kyung Wook Hwang, Hwaseong-si (KR); Jung Sung Kim, Seoul (KR); Nam Goo Cha, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/630,431

(22) Filed: Feb. 24, 2015

(65) Prior Publication Data

US 2016/0013366 A1 Jan. 14, 2016

(30) Foreign Application Priority Data

Jul. 10, 2014 (KR) ........................ 10-2014-0086983

(51) Int. Cl.
| | |
|---|---|
| *H01L 29/06* | (2006.01) |
| *H01L 33/24* | (2010.01) |
| *H01L 33/08* | (2010.01) |
| *H01L 33/18* | (2010.01) |
| *H01L 33/38* | (2010.01) |
| *H01L 33/46* | (2010.01) |
| *H01L 33/02* | (2010.01) |

(52) U.S. Cl.
CPC ............ *H01L 33/24* (2013.01); *H01L 33/08* (2013.01); *H01L 33/18* (2013.01); *H01L 33/02* (2013.01); *H01L 33/38* (2013.01); *H01L 33/46* (2013.01)

(58) Field of Classification Search
CPC .................................................... H01L 27/153

USPC ............................................. 257/13; 438/35
See application file for complete search history.

(56) References Cited

U.S. PATENT DOCUMENTS

| | | |
|---|---|---|
| 6,372,608 B1 | 4/2002 | Shimoda et al. |
| 6,468,347 B1 | 10/2002 | Motoki et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |

(Continued)

*Primary Examiner* — Jami M Valentine
(74) *Attorney, Agent, or Firm* — Lee & Morse, P.C.

(57) ABSTRACT

A nanostructure semiconductor light-emitting device includes a base layer formed of a first conductivity-type semiconductor, a first material layer disposed on the base layer and including a plurality of openings, a plurality of light-emitting nanostructures, each of which extends through each of the plurality of openings and includes a nanocore formed of a first conductivity-type semiconductor, an active layer and a second conductivity-type semiconductor shell layer, sequentially disposed on the nanocore, a filling layer disposed on the first material layer, wherein the filling layer fills spaces between the plurality of light-emitting nanostructures and a portion of each of the plurality of light-emitting nanostructures is exposed by the filling layer, a second conductivity-type semiconductor extension layer disposed on the filling layer and covering the exposed portion of each of the plurality of light-emitting nanostructures, and a contact electrode layer disposed on the second conductivity-type semiconductor extension layer.

20 Claims, 13 Drawing Sheets

(56) References Cited

U.S. PATENT DOCUMENTS

| | | | |
|---|---|---|---|
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,396,696 B2 | 7/2008 | Kim et al. | |
| 7,435,996 B2 | 10/2008 | Jin et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,227,817 B2 | 7/2012 | Pedersen et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,410,496 B2 | 4/2013 | Hersee et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,624,482 B2 | 1/2014 | Lin | |
| 8,648,328 B2 | 2/2014 | Crowder et al. | |
| 8,664,641 B2 * | 3/2014 | Yi | B82B 1/00 257/24 |
| 8,735,931 B2 | 5/2014 | Han et al. | |
| 8,766,295 B2 | 7/2014 | Kim | |
| 2009/0309107 A1 | 12/2009 | Kang | |
| 2010/0148149 A1 | 6/2010 | Pedersen et al. | |
| 2011/0240959 A1 | 10/2011 | Konsek et al. | |
| 2011/0309382 A1 * | 12/2011 | Lowgren | B82Y 20/00 257/88 |
| 2013/0092900 A1 | 4/2013 | Lowgren et al. | |
| 2013/0313514 A1 | 11/2013 | Hwang et al. | |
| 2014/0209859 A1 * | 7/2014 | Cha | H01L 33/005 257/13 |
| 2015/0102365 A1 * | 4/2015 | Cha | H01L 33/24 257/88 |
| 2015/0236202 A1 * | 8/2015 | Chun | H01L 33/24 257/88 |
| 2015/0280062 A1 * | 10/2015 | Yoo | H01L 33/18 257/13 |
| 2015/0364642 A1 * | 12/2015 | Cha | H01L 33/005 438/35 |
| 2016/0049553 A1 * | 2/2016 | Sim | H01L 33/24 257/13 |
| 2016/0064607 A1 * | 3/2016 | Yoo | H01L 33/24 257/13 |
| 2016/0064609 A1 * | 3/2016 | Cha | H01L 33/24 257/13 |

* cited by examiner

NANOSTRUCTURE SEMICONDUCTOR LIGHT-EMITTING DEVICE

CROSS-REFERENCE TO RELATED APPLICATION

This application claims priority under 35 U.S.C. §119 to Korean Patent Application No. 10-2014-0086983 filed on Jul. 10, 2014, with the Korean Intellectual Property Office, the disclosure of which is incorporated herein by reference.

BACKGROUND

Recently, semiconductor light-emitting devices provided with nanostructures have been developed as a new type of semiconductor light-emitting device technology. In semiconductor light-emitting devices employing nanostructures (hereinafter, referred to as 'nanostructure semiconductor light-emitting devices'), crystallinity may be significantly improved and degradations in performance due to polarization may be prevented, since active layers are obtained from a nonpolar surface or a semipolar surface. In addition, since light is emitted through a relatively large surface area, light extraction efficiency may be significantly improved.

SUMMARY

An aspect of the present disclosure may provide a nanostructure semiconductor light-emitting device having improved light extraction efficiency.

According to an aspect of the present disclosure, a nanostructure semiconductor light-emitting device includes a base layer formed of a first conductivity-type semiconductor, a first material layer disposed on the base layer and including a plurality of openings, a plurality of light-emitting nanostructures, each of which extends through each of the plurality of openings and includes a nanocore formed of a first conductivity-type semiconductor, an active layer and a second conductivity-type semiconductor shell layer, sequentially disposed on the nanocore, a filling layer disposed on the first material layer, wherein the filling layer fills spaces between the plurality of light-emitting nanostructures and a portion of each of the plurality of light-emitting nanostructures is exposed by the filling layer, a second conductivity-type semiconductor extension layer disposed on the filling layer and covering the exposed portion of each of the plurality of light-emitting nanostructures, and a contact electrode layer disposed on the second conductivity-type semiconductor extension layer.

In some embodiments, each of the plurality of light-emitting nanostructures may include a body having a first crystal plane and a tip having a second crystal plane different from the first crystal plane.

Here, the exposed portion of each of the plurality of light-emitting nanostructures may include at least the tip of each of the plurality of light-emitting nanostructures.

In addition, a height of the filling layer may be greater than about 50% of a height of the body of each of the plurality of light-emitting nanostructures.

In some embodiments, the nanostructure semiconductor light-emitting device may further include a reflective metal layer disposed on the contact electrode layer.

Here, a lower surface of the reflective metal layer may be planar.

In some embodiments, the nanostructure semiconductor light-emitting device may further include an omnidirectional reflector disposed on the contact electrode layer.

Here, an upper surface of the second conductivity-type semiconductor extension layer may not be planar, and an upper surface of the omnidirectional reflector may be formed according to a shape of the upper surface of the second conductivity-type semiconductor extension layer.

The omnidirectional reflector may include first and second refraction layers having different refractive indices.

In some embodiments, portions of the second conductivity-type semiconductor extension layer corresponding to each of the plurality of light-emitting nanostructures may be connected to each other.

Here, an upper surface of the second conductivity-type semiconductor extension layer may be planar.

In some embodiments, the nanostructure semiconductor light-emitting device may further include a first electrode disposed on a portion of an upper surface of the contact electrode layer, and a second electrode disposed on a portion of one of an upper surface and a lower surface of the base layer.

In some embodiments, a plurality of protrusions may be formed on a lower surface of the base layer.

In some embodiments, the nanostructure semiconductor light-emitting device may further include a graded refractive index layer disposed on a lower surface of the base layer, wherein the graded refractive index layer comprises a plurality of layers having refractive indices gradually decreasing away from the lower surface of the base layer.

In some embodiments, the nanostructure semiconductor light-emitting device may further include a growth substrate disposed on the base layer, wherein an upper surface of the growth substrate has a plurality of protrusions.

In some embodiments, the contact electrode layer may be in direct contact with the filling layer.

According to another aspect of the present disclosure, a nanostructure semiconductor light-emitting device includes a base layer formed of a first conductivity-type semiconductor, a first material layer disposed on the base layer and including a plurality of openings, a plurality of nanostructures extending through each of the plurality openings, wherein each of the plurality of nanostructures includes a nanocore formed of a first conductivity-type semiconductor and an active layer disposed on the nanocore, a second conductivity-type semiconductor layer including a plurality of shell layers, each of which surrounds each of the plurality of nanostructures, and an extension layer connecting each of the plurality of shell layers, and a contact electrode layer disposed on the second conductivity-type semiconductor layer.

According to another aspect of the present disclosure, a nanostructure semiconductor light-emitting device includes abase layer formed of a first conductivity-type semiconductor, a first material layer disposed on the base layer and including a plurality of openings, a plurality of light-emitting nanostructures protruding from the base layer and extending through the plurality of openings, a filling layer disposed on the first material layer and filling spaces between the plurality of light-emitting nanostructures, a portion of each of the plurality of light-emitting nanostructures exposed by the filling layer, a second conductivity-type semiconductor extension layer disposed on the filling layer and covering the exposed portion of each of the plurality of light-emitting nanostructures, and a contact electrode layer disposed on the second conductivity-type semiconductor extension layer. An upper surface of the second conductivity-type semiconductor extension layer may be uneven.

In some embodiments, the upper surface of the second conductivity-type semiconductor extension layer at an area over the plurality of light-emitting nanostructures may have a level higher than that of an area excluding the area over the plurality of light-emitting nanostructures.

In some embodiments, the nanostructure semiconductor light-emitting device may further include an omnidirectional reflector disposed on the contact electrode layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
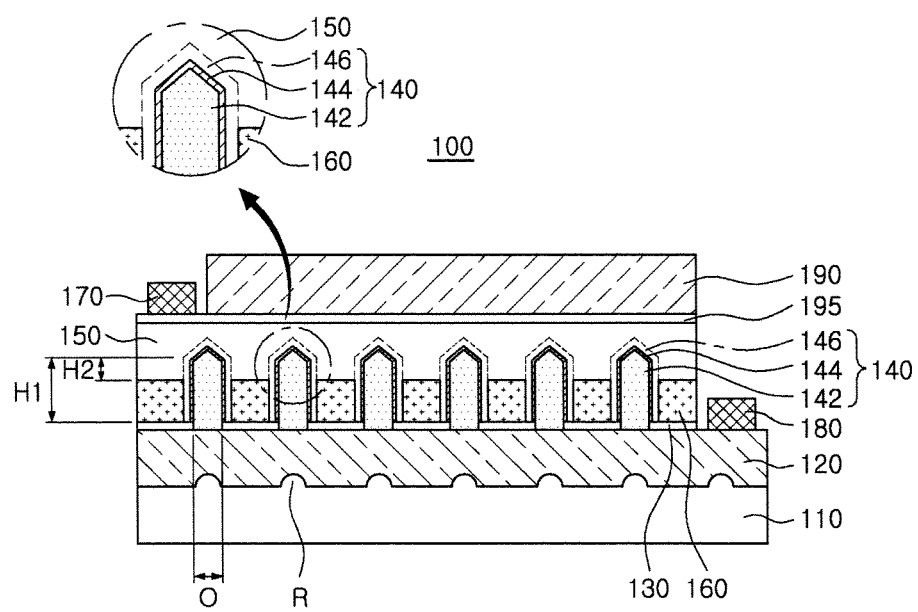
FIG. 1 is a cross-sectional view of a nanostructure semiconductor light-emitting device according to an exemplary embodiment in the present disclosure.

Hereinafter, embodiments in the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

References throughout this disclosure to "one exemplary embodiment" or "an exemplary embodiment" are provided to emphasize particular features, structures, or characteristics, and do not necessarily refer to the same embodiment. Furthermore, the particular features, structures, or characteristics may be combined in any suitable manner in one or more embodiments. For example, a context described in a specific exemplary embodiment may be used in other embodiments, even if it is not described in the other embodiments, unless it is described contrary to or in a manner inconsistent with the context in the other embodiments.

FIG. 1 is a cross-sectional view of a nanostructure semiconductor light-emitting device according to an exemplary embodiment in the present disclosure.

Referring to FIG. 1, a nanostructure semiconductor light-emitting device 100 may include a growth substrate 110, a base layer 120, a first material layer 130, a plurality of light-emitting nanostructures 140, a second conductivity-type semiconductor extension layer 150, a filling layer 160, a reflective metal layer 190, and a contact electrode layer 195. Each of the light-emitting nanostructures 140 may include a nanocore 142, an active layer 144, and a second conductivity-type semiconductor shell layer 146. The nanostructure semiconductor light-emitting device 100 may further include first and second electrodes 170 and 180 electrically connected to the contact electrode layer 195 and the base layer 120, respectively. A side portion of the nanostructure semiconductor light-emitting device 100 may be removed to expose an upper surface of the base layer 120, and then the second electrode 180 may be disposed on the exposed upper surface of the base layer 120.

Unless described otherwise, throughout this disclosure, terms such as "on," "upper surface," "under," "lower surface," "upward," "downward," "side surface," "high," and "low" may be relative terms based on the drawings, and may vary, depending on a direction in which a light-emitting device is disposed. Further, it will be understood that when a layer is referred to as being "on" or "under" another layer or a substrate, the layer may be formed directly on the other layer or the substrate, or an intervening layer may exist between the layer and the other layer or the substrate.

The growth substrate 110 may be provided as a growth substrate for the base layer 120. The growth substrate 110 may be an insulating material, a conductive material, or a semiconductor material, such as sapphire, silicon carbide (SiC), spinel (MgAl$_2$O$_4$), magnesium oxide (MgO), lithium aluminate (LiAlO$_2$), lithium dioxogallate (LiGaO$_2$), and gallium nitride (GaN). Sapphire, widely used as a growth substrate for a nitride semiconductor, is a crystal body having Hexa-Rhombo R3c symmetry, has a lattice constant of 13.001 Å in a c-axis orientation and 4.758 Å in an a-axis orientation, and has a c-plane (0001), an a-plane (11-20), an r-plane (1-102), and the like. In this case, since the c-plane allows a nitride thin film to be relatively easily grown thereon and is stable even at high temperatures, sapphire is predominantly utilized as a growth substrate for a nitride. Meanwhile, as another substrate suitable for use as the growth substrate 110, a Si substrate may be used. Since the Si substrate is appropriate for obtaining a large diameter and has relatively low manufacturing costs, mass productivity may be improved. When the Si substrate is used, a nucleation layer formed of a material such as Al$_x$Ga$_{1-x}$N (0≤x≤1) is formed on the growth substrate 110, and then a nitride semiconductor having a preferred structure may be grown thereon.

Protrusions R may be formed on an upper surface of the growth substrate 110. The shape of protrusions R may not be limited to that illustrated in FIG. 1. The protrusions R may serve to improve light extraction efficiency and a level of quality of a single crystal grown on the growth substrate 110.

The base layer 120 may be disposed on the growth substrate 110. The base layer 120 may be a first conductivity-type semiconductor material, for example, a nitride semiconductor material satisfying $Al_xIn_yGa_{1-x-y}N$ ($0 \leq x \leq 1$, $0 \leq y \leq 1$, and $0 \leq x+y \leq 1$). The base layer 120 may be, for example, doped with n-type impurities, such as Si.

In the exemplary embodiment, the base layer 120 may not only provide a crystal plan for growing the nanocores 142 of the light-emitting nanostructures 140, but also function as a contact electrode layer by being commonly connected to one ends of the light-emitting nanostructures 140.

The first material layer 130 may be disposed on the base layer 120. The first material layer 130 may be formed of silicon oxide or silicon nitride, for example, at least one of $SiO_x$, $SiO_xN_y$, $Si_xN_y$, $Al_2O_3$, TiN, AlN, ZrO, TiAlN, and TiSiN. The first material layer 130 may include a plurality of openings O exposing portions of the base layer 120. Depending on the size of the plurality of openings O, a diameter, a length, a position, and growth conditions of the nanocores 142 may be determined. The plurality of openings O may have a variety of shapes, such as circular, tetragonal, or hexagonal shapes.

The first material layer 130 may function to prevent the active layers 144 and the second conductivity-type semiconductor shell layers 146 from being connected to the base layer 120.

Each of the plurality of light-emitting nanostructures 140 may be disposed in locations corresponding to each of the plurality of openings O. Each of the light-emitting nanostructures 140 may have a core-shell structure including the nanocore 142 grown from the base layer 120 exposed by the plurality of openings O, and the active layer 144 and the second conductivity-type semiconductor shell layer 146 sequentially grown on the surface of the nanocore 142.

Figure 2:
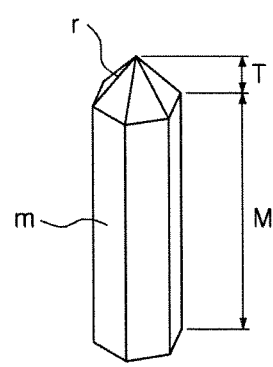
FIG. 2 is a schematic perspective view illustrating an example of a nanocore applicable to the nanostructure semiconductor light-emitting device of FIG. 1.

FIG. 2 is a view schematically illustrating a shape of light-emitting nanostructures according to an exemplary embodiment in the present disclosure.

Referring to FIG. 2, each of the light-emitting nanostructures 140 according to the exemplary embodiment in the present disclosure may include a body M having a hexagonal pillar structure, and a tip T located on the body M. Lateral surfaces of the bodies M of the light-emitting nanostructures 140 may have the same crystal plane, and the tips T of the light-emitting nanostructures 140 may have different crystal planes from the lateral surfaces of the light-emitting nanostructures 140. The tips T of the light-emitting nanostructures 140 may have a hexagonal pyramid structure. For example, when a growth plane of the base layer 120 is c-plane, the lateral surfaces of the body M may be non-polar planes m and the surfaces of the tips T may be a semi-polar plane r.

Referring again to FIG. 1, the nanocores 142 and the second conductivity-type semiconductor shell layers 146 may be respectively formed of a first conductivity-type semiconductor material and a second conductivity-type semiconductor material. The first and second conductivity-type semiconductor materials may be semiconductor materials doped with n-type and p-type impurities, respectively, but may not be limited thereto. The first and second conductivity-type semiconductor materials may be semiconductor materials doped with p-type and n-type impurities, respectively. The nanocores 142 and the second conductivity-type semiconductor shell layers 146 may be formed of a nitride semiconductor material, for example, $Al_xIn_yGa_{1-x-y}N$ ($0 \leq x \leq 1$, $0 \leq y \leq 1$, and $0 \leq x+y \leq 1$). Each of the nanocores 142 and the second conductivity-type semiconductor shell layers 146 may be formed as a single layer, or as a plurality of layers having different doping concentrations, compositions, and the like. However, the nanocores 142 and the second conductivity-type semiconductor shell layers 146 may include an AlInGaP-base or AlInGaAs-base semiconductor material besides the nitride semiconductor. In the exemplary embodiment, the nanocores 142 may be, for example, n-GaN doped with Si or C, and the second conductivity-type semiconductor shell layers 146 may be p-GaN doped with Mg or Zn.

The active layers 144 may be disposed on the surfaces of the nanocores 142. The active layers 144 may have a multi-quantum well (MQW) structure in which quantum well layers and quantum barrier layers are alternately stacked. For example, in the case of a nitride semiconductor material, the active layers 144 may have a GaN/InGaN MQW structure. As necessary, the active layers 144 may have a single-quantum well (SQW) structure.

The filling layer 160 may be disposed on the first material layer 130, and may fill spaces between the plurality of light-emitting nanostructures 140. That is, the filling layer 160 may be disposed between the light-emitting nanostructures 140 adjacent to each other, and function as a support preventing collapse of the light-emitting nanostructures 140.

The filling layer 160 may be, but is not limited to, formed of an insulating material. For example, the filling layer 160 may be one of silicon dioxide ($SiO_2$), tetraethyl orthosilicate (TEOS), borophosphosilicate glass (BPSG), spin-on-glass (SOG), and spin-on-dielectric (SOD).

The height of the filling layer 160 may be smaller than that of the light-emitting nanostructures 140 so that portions of the light-emitting nanostructures 140 are exposed without being covered by the filling layer 160. For example, the exposed portions of the light-emitting nanostructures 140 may include, at least, the tips T (please refer to FIG. 2) of the light-emitting nanostructures 140.

Figure 12:
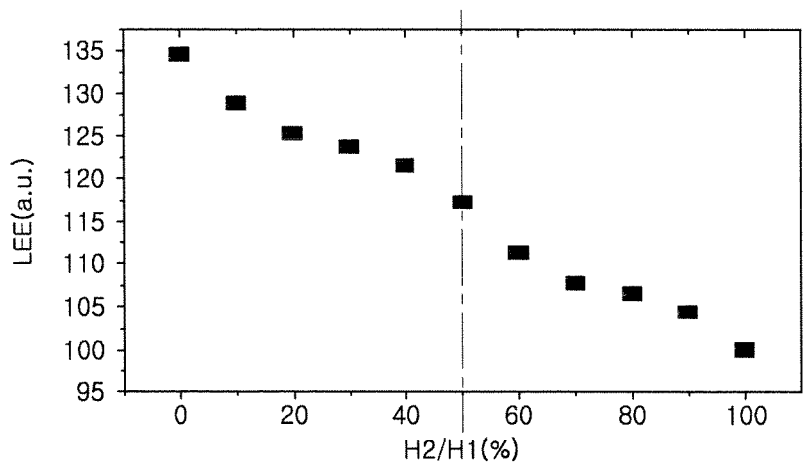
FIG. 12 is a graph illustrating changes in light extraction efficiency LEE according to changes in ratios of a difference H2 between a height of a body of a light-emitting nanostructure and a height of a filling layer to the height H1 of the body of the light-emitting nanostructure, according to an exemplary embodiment of the present disclosure.

FIG. 12 is a graph illustrating the change in light extraction efficiency LEE according to the change in a ratio H2/H1 of a difference H2 (please refer to FIGS. 1 and 3E) between a height of a body M (please refer to FIG. 2) of a light-emitting nanostructure 140 and a height of a filling layer 160 (please refer to FIG. 1) to the height H1 (please refer to FIGS. 1 and 3E) of the body M of the light-emitting nanostructure 140 (please refer to FIG. 1).

Referring to FIG. 12, the relationship between the height of the filling layer 160 and the light extraction efficiency LEE is illustrated. The light extraction efficiency increases as the ratio H2/H1 decreases. In order to obtain high light extraction efficiency, the ratio H2/H1 may be in the range of 0 to 0.5, for example. That is, the height of the filling layer 160 may be greater than about 50% of the height H1 of the body M of the light-emitting nanostructures 140.

Referring again to FIG. 1, the second conductivity-type semiconductor extension layer 150 may be disposed on the filling layer 160 to cover the exposed portion of the plurality of light-emitting nanostructures 140. The second conductivity-type semiconductor extension layer 150 may be formed of the same material as the second conductivity-type semiconductor shell layers 146. Upper surface of the second conductivity-type semiconductor extension layer 150 may be planarized to suppress the decrease in light extraction efficiency by reducing the number of reflection of light emitted from the light-emitting nanostructures 140. In addition, the second conductivity-type semiconductor extension layer 150 corresponding to each of the light-emitting nanostructures 140 may coalesce.

The contact electrode layer 195 may be disposed on the second conductivity-type semiconductor extension layer 150. The contact electrode layer 195 may be a continuous layer covering the entire second conductivity-type semiconductor extension layer 150. The contact electrode layer 195 may be a light-reflective material, for example, aluminum (Al) or silver (Ag), which reflects light emitted from the light-emitting nanostructures 140. When the contact electrode layer 195 is surrounding and in direct contact with the light-emitting nanostructures 140, the number of reflection of light emitted from the light-emitting nanostructures 140 by the contact electrode layer 195 may be greater than when the contact electrode layer 195 is spaced apart from the light-emitting nanostructures 140. As the number of reflection increases, the light extraction efficiency may decrease. Accordingly, in order to suppress the decrease in light extraction efficiency by reducing the number of reflection of light emitted from the light-emitting nanostructures 140, a reflection surface, that is, a lower surface of the contact electrode layer 195 may be spaced apart from the light-emitting nanostructures 140 by the second conductivity-type semiconductor extension layer 150. For example, the lower surface of the contact electrode layer 195 may be planar. Light reflected by the contact electrode layer 195 may be guided to a bottom of the nanostructure semiconductor light-emitting device 100 to be discharged.

In the exemplary embodiment, a reflective metal layer 190 may be further formed on the contact electrode layer 195. The reflective metal layer 190 may be a light-reflective material, for example, Al or Ag, which reflects light emitted from the light-emitting nanostructures 140. In this case, the contact electrode layer 195 may be one of a transparent conductive oxide layer or nitride layer, and the light emitted from the light-emitting nanostructures 140 may pass through the contact electrode layer 195 to be reflected by the reflective metal layer 190. The transparent conductive contact electrode layer 195 may be at least one selected from the group consisting of, for example, indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). As necessary, the contact electrode layer 195 may include graphene. In order to suppress the decrease in light extraction efficiency by reducing the number of reflection of light emitted from the light-emitting nanostructures 140, a reflection surface, that is, a lower surface of the reflective metal layer 190 may be planarized.

FIGS. 3A to 3G are process views illustrating a method of manufacturing the nanostructure semiconductor light-emitting device 100 of FIG. 1.

The manufacturing method may start with providing a base layer 120 formed of a first conductivity-type semiconductor material.

Figure 3A:
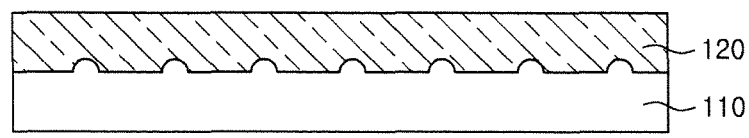
FIGS. 3A to 3G are process views illustrating a method of manufacturing a nanostructure semiconductor light-emitting device according to an exemplary embodiment in the present disclosure.

As illustrated in FIG. 3A, a base layer 120 may be provided by growing a first conductivity-type semiconductor on a growth substrate 110. The base layer 120 may be grown by, for example, a metal organic chemical vapor deposition (MOCVD), a hydride vapor phase epitaxy (HVPE), a molecular beam epitaxy (MBE), or the like.

Figure 3B:
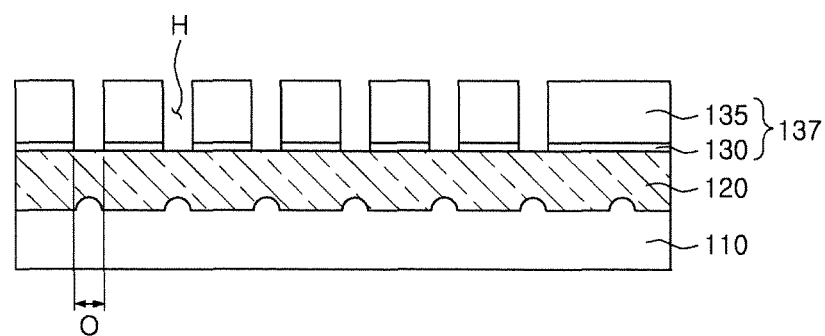

Next, as illustrated in FIG. 3B, a mask 137 having a plurality of openings O may be formed on the base layer 120.

The mask 137 may be obtained by sequentially forming a first material layer 130 and a second material layer 135 on the base layer 120. The first material layer 130 may be an electrically insulating material and, as necessary, the second material layer 135 may also be an insulating material. The first material layer 130 may be a material having a significantly lower etch rate than the second material layer 135, under the same conditions. Accordingly, the first material layer 130 may be provided as an etch stop layer for the second material layer 135. For example, the first material layer 130 may be silicon nitride (SiN), and the second material layer 135 may be $SiO_2$.

On the other hand, the difference in etch rate may be obtained using a difference in pore density. The difference in etch rate between the first and second material layers 130 and 135 may be secured by forming the second material layer 135 or both of the first and second material layers 130 and 135 with a porous materials having different porosity. In this case, the first and second material layers 130 and 135 may be formed of the same material. For example, the first material layer 130 may be $SiO_2$ having a first porosity and the second material layer 135 may be formed of $SiO_2$, that is, the same material as the first material layer 130, having a second porosity greater than the first porosity. Thus, the first material layer 130 may have a lower etch rate than the second material layer 135 under the condition of the second material layer 135 being etched.

Next, a plurality of holes H may be formed by puncturing the first material layer 130 and the second material layer 135, and thus a plurality of openings O exposing the base layer 120 may be formed on the first material layer 130. The plurality of holes H may be formed by, for example, a dry etching process. More specifically, the plurality of holes H may be formed by plasma etching using a gas, such as tetrafluoromethane ($CF_4$), hexafluoroethane ($C_2F_6$), octafluoropropane ($C_3F_8$), octafluorocyclobutane ($C_4F_8$), or trifluoromethane ($CHF_3$), combined with, at least, one of oxygen ($O_2$) or argon (Ar).

Thicknesses of the first material layer 130 and second material layer 135 may be designed in consideration of the height of the light-emitting nanostructures 140. In addition, the size of the openings O exposing the base layer 120 may be designed in consideration of a preferred size of the light-emitting nanostructures 140.

A planar shape of the plurality of openings O may be implemented in various shapes, such as polygonal, tetragonal, oval, or circular shapes, as necessary.

The holes H in FIG. 3B is illustrated in a rod shape, but are not limited thereto. The holes H may have a variety of shapes by using an appropriate etching process. For example, the holes H may have a pillar shape having a width tapered toward a bottom or toward a top.

Figure 3C:
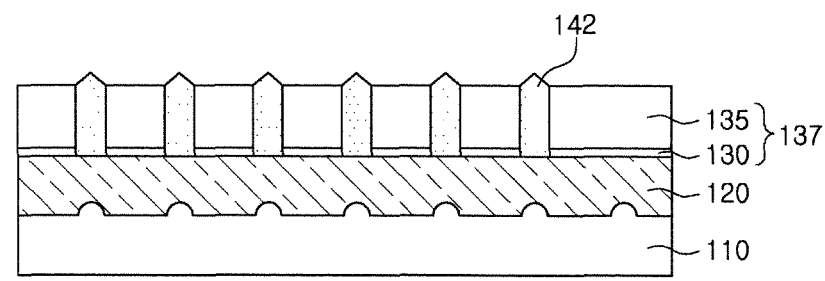

Next, as illustrated in FIG. 3C, each of a plurality of nanocores 142 having a shape according to the shape of the holes H may be formed by growing a first conductivity-type semiconductor in each of the openings O (please refer to FIG. 3B) exposing the base layer 120 to fill the plurality of holes H (please refer to FIG. 3B). The nanocores 142 may be formed of, for example, an n-type nitride semiconductor material, the same type of material as that of the base layer 120. Here, the method of growing the first conductivity-type semiconductor may be, for example, MOCVD, HVPE, MBE, or the like.

Figure 3D:
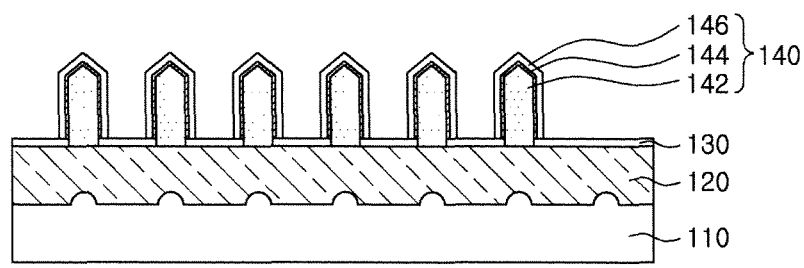

Next, as illustrated in FIG. 3D, lateral surfaces of the plurality of nanocores 142 may be exposed by removing the second material layer 135 (please refer to FIG. 3C). Here, only the second material layer 135 may be selectively etched, and the first material layer 130 may be used as an etch stop layer with respect to the second material layer 135.

In some embodiments, after the second material layer 135 is removed, a heat treatment process may be additionally performed in order to convert a crystal plane of the nanocores 142 into a stable plane favorable for crystal growth, such as a semi-polar or a non-polar crystal plane.

Next, an active layer 144 and a second conductivity-type semiconductor shell layer 146 may be sequentially grown on each of the plurality of nanocores 142. After the growth, each of the light-emitting nanostructures 140 may have a core-shell structure formed of the nanocore 142, the active layer 144, and the second conductivity-type semiconductor shell layer 146.

Figure 3E:
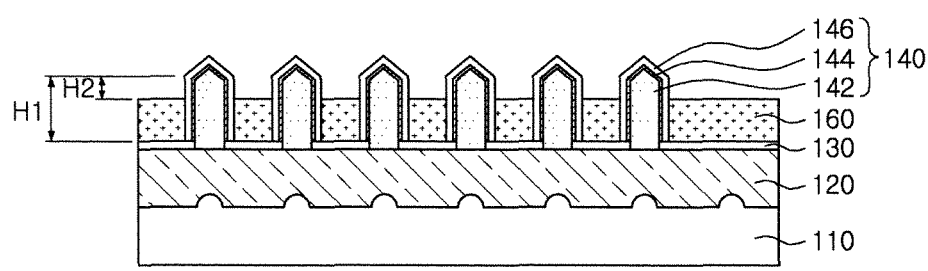

Next, as illustrated in FIG. 3E, a filling layer 160 may be formed on the first material layer 130 to fill spaces between the plurality of light-emitting nanostructures 140. The filling layer 160 may be formed using an appropriate method depending on a material thereof. For example, the filling layer 160 may be formed using a coating process, such as spin coating, spray coating, or reflow, as well as a deposition process, such as chemical vapor deposition (CVD) or physical vapor deposition (PVD).

The filling layer 160 may be formed such that a portion of each of the plurality of light-emitting nanostructures 140 is not fully covered by the filling layer 160. For example, a height of the filling layer 160 may be smaller than the height of the light-emitting nanostructures 140. In addition, the height of the filling layer 160 may be greater than about 50% of the height of the body M (please refer to FIG. 2) of the light-emitting nanostructures 140. That is, a ratio (H2/H1) of the difference H2 between the height of the body M (please refer to FIG. 2) of the light-emitting nanostructures 140 and the height of the filling layer 160 (please refer to FIG. 1) with respect to the height H1 of the light-emitting nanostructures 140 (please refer to FIG. 1) may be less than 50%.

Figure 3F:
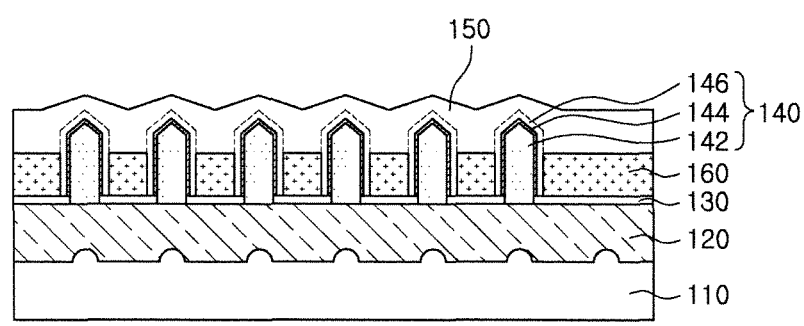

Next, as illustrated FIG. 3F, the second conductivity-type semiconductor extension layer 150 may be grown on the exposed portion of each of the plurality of light-emitting nanostructures 140 and the filling layer 160. The method of growing the second conductivity-type semiconductor extension layer 150 may be the same as the method of growing the second conductivity-type semiconductor shell layers 146. The second conductivity-type semiconductor extension layer 150 may be disposed on the filling layer 160 to cover the exposed portion of each of the plurality of the light-emitting nanostructures 140. The second conductivity-type semiconductor extension layer 150 may be grown until uneven upper surfaces of the second conductivity-type semiconductor extension layer 150 illustrated in FIG. 3F are planarized.

Figure 3G:
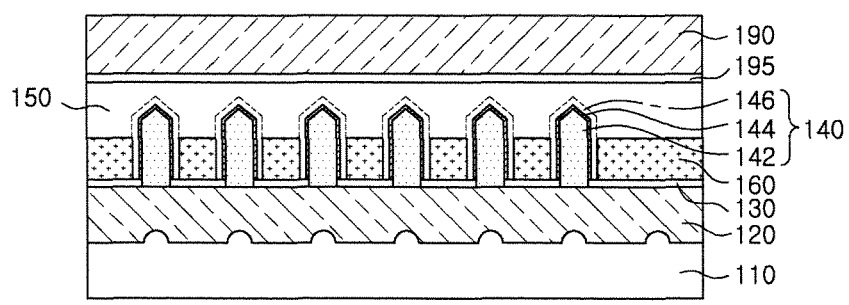

Next, as illustrated in FIG. 3G, a contact electrode layer 195 may be formed on the second conductivity-type semiconductor extension layer 150. The contact electrode layer 195 may be formed by CVD or PVD, for example. Next, a reflective metal layer 190 may be formed on the contact electrode layer 195. The method of forming the reflective metal layer 190 may be the same as the method of forming the contact electrode layer 195.

Figure 4:
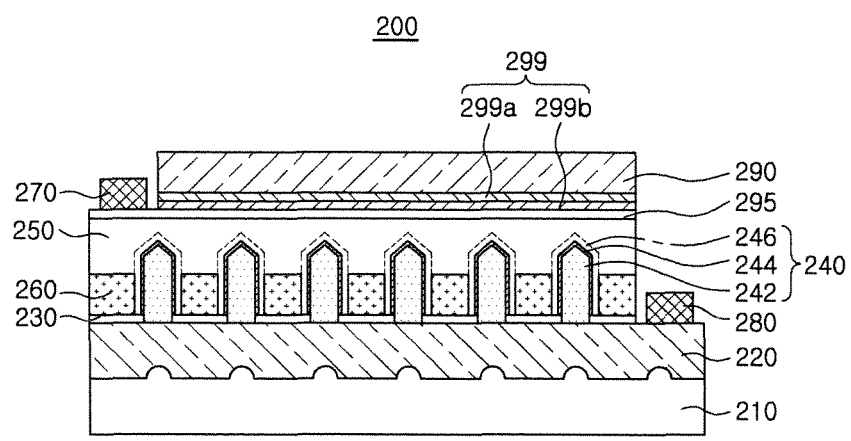
FIGS. 4 to 11 are cross-sectional views illustrating nanostructure semiconductor light-emitting devices according to exemplary embodiments in the present disclosure.

FIG. 4 is a schematic cross-sectional view of a nanostructure semiconductor light-emitting device according to an exemplary embodiment in the present disclosure. Hereinafter, descriptions duplicated with those in FIG. 1 will be omitted.

Referring to FIG. 4, a nanostructure semiconductor light-emitting device 200 may include a growth substrate 210, a base layer 220, a first material layer 230, a plurality of light-emitting nanostructures 240, a second conductivity-type semiconductor extension layer 250, a filling layer 260, an omnidirectional reflector (ODR) 299, a reflective metal layer 290, and a contact electrode 295. Each of the plurality of light-emitting nanostructures 240 may include a nanocore 242, an active layer 244, and a second conductivity-type semiconductor shell layer 246. The nanostructure semiconductor light-emitting device 200 may further include first and second electrodes 270 and 280 electrically connected to the contact electrode 295 and the base layer 220, respectively.

The omnidirectional reflector 299 may be disposed on the contact electrode 295. The omnidirectional reflector 299 may include first and second refraction layers 299a and 299b having different refractive indices. Each of the first and second refraction layers 299a and 299b is illustrated as a single layer in FIG. 4, but is not limited thereto. The omnidirectional reflector 299 may have a structure in which two or more first refraction layers 299a and two or more second refraction layers 299b are alternately disposed, or a single layer of first refraction layer 299a and a single layer of second refraction layer 299b are alternately disposed more than once.

For example, the first refraction layer 299a may have a first refractive index, and the second refraction layer 299b may have a second refractive index smaller than the first refractive index. In addition, the first refraction layer 299a may have a greater resistivity than the second refraction layer 299b.

Refractive indices and thicknesses of the first and second refraction layers 299a and 299b may be selected and designed such that the omnidirectional reflector 299 has a high reflectivity of greater than 95% with respect to a wavelength of light generated from the active layers 244. In addition, the number of repetition of the first and second refraction layers 299a and 299b may be determined so as to ensure high reflectivity. For example, when the difference in refractive indices between the first and second refraction layers 299a and 299b is relatively large, the number of repetition of the first and second refraction layers 299a and 299b may be relatively small. On the other hand, when the difference in refractive indices between the first and second refraction layers 299a and 299b is relatively low, the amount of repetitions of the first and second refraction layers 299a and 299b may be relatively large.

Figure 5:
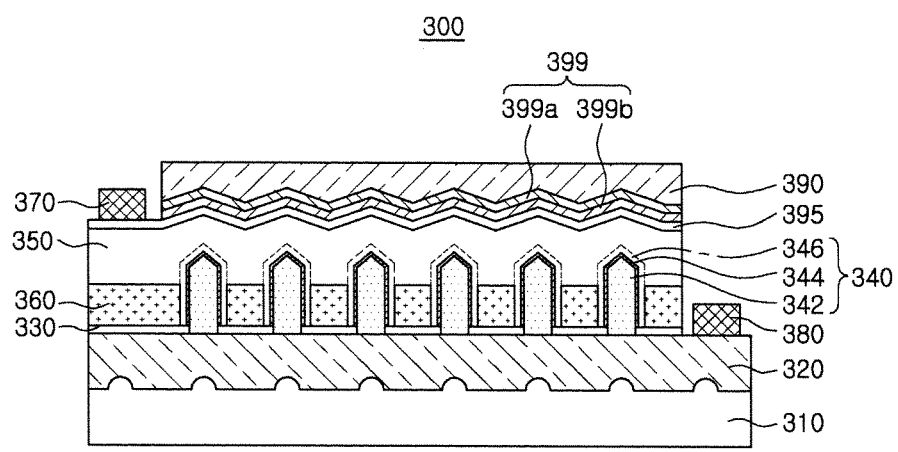

FIG. 5 is a schematic cross-sectional view of a nanostructure semiconductor light-emitting device according to an exemplary embodiment in the present disclosure. Hereinafter, descriptions duplicated with those in FIG. 1 will be omitted.

Referring to FIG. 5, a nanostructure semiconductor light-emitting device 300 may include a growth substrate 310, a base layer 320, a first material layer 330, a plurality of light-emitting nanostructures 340, a second conductivity-type semiconductor extension layer 350 having an uneven upper surface, a filling layer 360, an omnidirectional reflector 399 conformally formed according to the shape of the upper surfaces of the second conductivity-type semiconductor extension layer 350, a reflective metal layer 390, and a contact electrode 395. Each of the plurality of light-emitting nanostructures 340 may include a nanocore 342, an active layer 344, and a second conductivity-type semiconductor shell layer 346. The nanostructure semiconductor light-emitting device 300 may further include first and second electrodes 370 and 380 electrically connected to the contact electrode 395 and the base layer 320, respectively.

The second conductivity-type semiconductor extension layer 350 may be grown before the upper surface thereof become planar. In this case, the second conductivity-type semiconductor extension layer 350 may have the uneven upper surface. The omnidirectional reflector 399 having first and second refraction layers 399a and 399b having different refractive indices may be formed on the second conductivity-type semiconductor extension layer 350 according to the shape of the upper surface of the second conductivity-type semiconductor extension layer 350.

Figure 6:
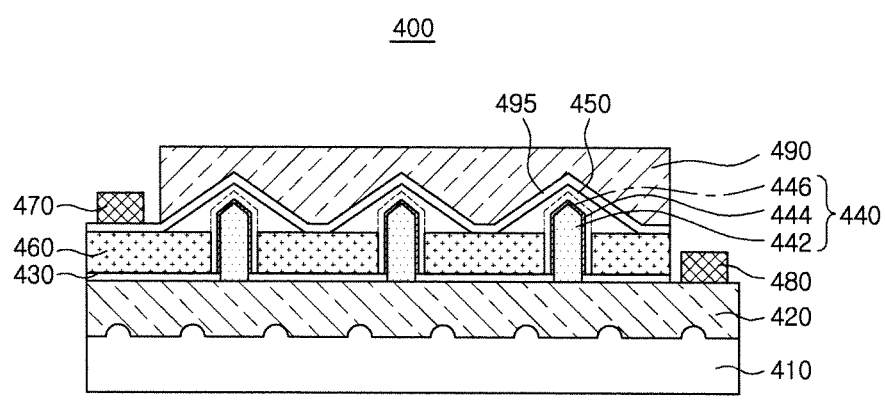

FIG. 6 is a schematic cross-sectional view of a nanostructure semiconductor light-emitting device according to an exemplary embodiment in the present disclosure. Hereinafter, descriptions duplicated with those in FIG. 1 will be omitted.

Referring to FIG. 6, the nanostructure semiconductor light-emitting device 400 may include a growth substrate 410, a base layer 420, a first material layer 430, a plurality of light-emitting nanostructures 440, a plurality of second conductivity-type semiconductor extension layers 450 spaced apart from each other on the plurality of light-emitting nanostructures 440, a filling layer 460, a reflective metal layer 490, and a contact electrode 495. Each of the plurality of light-emitting nanostructures 440 may include a nanocore 442, an active layer 444, and a second conductivity-type semiconductor shell layer 446. The nanostructure semiconductor light-emitting device 400 may further include first and second electrodes 470 and 480 electrically connected to the contact electrode 495 and the base layer 420, respectively.

The growth rate of the second conductivity-type semiconductor extension layer 450 may be greater on the second conductivity-type semiconductor shell layers 446 than on the filling layer 460. In this case, each of the plurality of second conductivity-type semiconductor extension layers 450 may be grown on each of the plurality of light-emitting nanostructures 440 and spaced apart from each other instead of coalescing into one layer.

The contact electrode 495 may cover the filling layer 460, which is not covered by the plurality of second conductivity-type semiconductor extension layers 450, and the entire second conductivity-type semiconductor extension layers 450. Accordingly, each of the second conductivity-type semiconductor extension layers 450 may be electrically connected to the first electrode 470 through the contact electrode 495.

Figure 7:
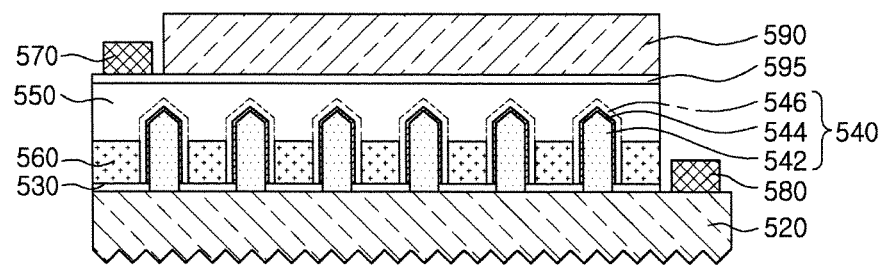

FIG. 7 is a schematic cross-sectional view of a nanostructure semiconductor light-emitting device according to an exemplary embodiment in the present disclosure. Hereinafter, descriptions duplicated with those in FIG. 1 will be omitted.

Referring to FIG. 7, the nanostructure semiconductor light-emitting device 500 may include a base layer 520 having an uneven lower surface, a first material layer 530, a plurality of light-emitting nanostructures 540, a second conductivity-type semiconductor extension layer 550, a filling layer 560, a reflective metal layer 590, and a contact electrode 595. Each of the plurality of light-emitting nanostructures 540 may include a nanocore 542, an active layer 544, and a second conductivity-type semiconductor shell layer 546. The nanostructure semiconductor light-emitting device 500 may further include first and second electrodes 570 and 580 electrically connected to the contact electrode 595 and the base layer 520, respectively.

A growth substrate (not shown) used to grow the base layer 520 may be fully or partially removed in order to improve optical or electrical properties of the nanostructure semiconductor light-emitting device 500. When the growth substrate is a sapphire substrate, the method of removing the growth substrate may include separating the growth substrate by radiating a laser beam into an interface between the growth substrate and the base layer 520 through the growth substrate. When the growth substrate is a silicon substrate or a silicon carbide substrate, it may be removed by polishing or etching.

After the growth substrate is removed, a plurality of protrusions may be formed on a lower surface of the base layer 520, and thereby the light extraction efficiency may be further improved. The plurality of protrusions may be obtained by wet etching, for example.

Figure 8:
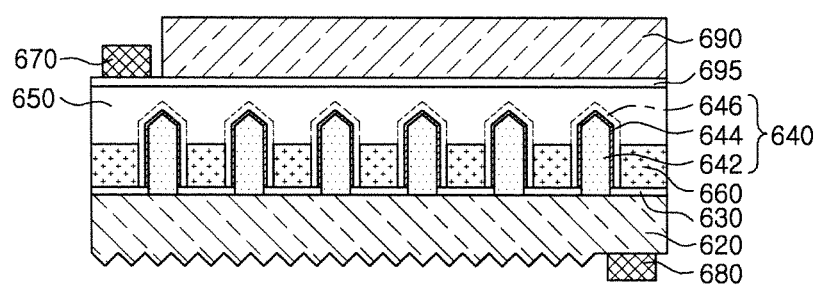

FIG. 8 is a schematic cross-sectional view of a nanostructure semiconductor light-emitting device 600 according to an exemplary embodiment in the present disclosure. Hereinafter, descriptions duplicated with those in FIGS. 1 and 7 will be omitted.

Referring to FIG. 8, the nanostructure semiconductor light-emitting device 600 may include a base layer 620 having an uneven lower surface, a first material layer 630, a plurality of light-emitting nanostructures 640, a second conductivity-type semiconductor extension layer 650, a filling layer 660, a reflective metal layer 690, and a contact electrode 695. Each of the plurality of light-emitting nanostructures 640 may include a nanocore 642, an active layer 644, and a second conductivity-type semiconductor shell layer 646. The nanostructure semiconductor light-emitting device 600 may further include first and second electrodes 670 and 680 electrically connected to the contact electrode 695 and the base layer 620, respectively. In this case, the second electrode 680 may be disposed on a portion of the lower surface of the base layer 620.

Figure 9:
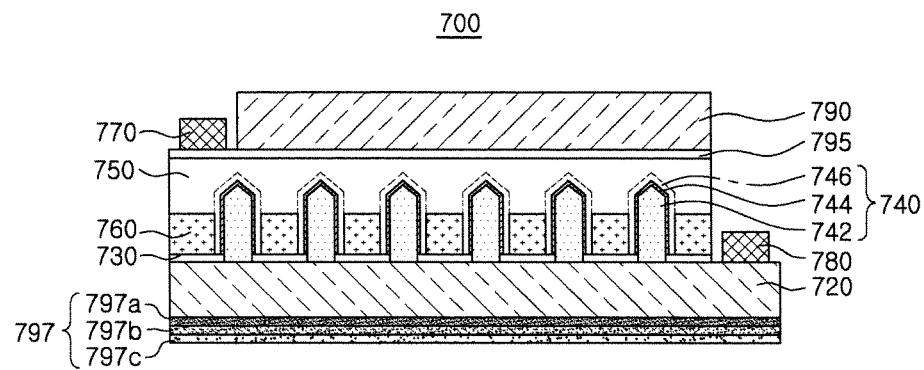

FIG. 9 is a schematic cross-sectional view of a nanostructure semiconductor light-emitting device 700 according to an exemplary embodiment in the present disclosure. Hereinafter, descriptions duplicated with those in FIGS. 1 and 7 will be omitted.

Referring to FIG. 9, the nanostructure semiconductor light-emitting device 700 may include a base layer 720, a first material layer 730, a plurality of light-emitting nanostructures 740, a second conductivity-type semiconductor extension layer 750, a filling layer 760, a reflective metal layer 790, a contact electrode 795, and a graded refractive index layer 797. Each of the plurality of light-emitting nanostructures 740 may include a nanocore 742, an active layer 744, and a second conductivity-type semiconductor shell layer 746. The nanostructure semiconductor light-emitting device 700 may further include first and second electrodes 770 and 780 electrically connected to the contact electrode 795 and the base layer 720, respectively.

The graded refractive index layer 797 may include a plurality of layers refractive indices of which gradually decrease away from the lower surface of the base layer 720. That is, a first refraction layer 797a, a second refraction layer 797b, and a third refraction layer 797c are sequentially disposed in a downward direction on the bottom surface of the base layer, and reflective indices of the layers may be downwardly decreased. In FIG. 9, the graded refractive index layer 797 is illustrated as having three layers with different refractive indices, but is not limited thereto. The graded refractive index layer 797 may include four or more layers.

Light having a specific wavelength transmitted through a thin film layer of which a refractive index distribution continuously changes may have an excellent light transmittance, since generation of light reflections thereof is suppressed when incident on a material having a different refractive index. Accordingly, when light generated from the light-emitting nanostructures 740 is incident into air passing through the graded refractive index layer 797, the generation of light reflection due to the difference in refractive indices may be suppressed to a minimum by disposing the graded refractive index layer 797 on the lower surface of the base layer 720. Accordingly, the nanostructure semiconductor light-emitting device 700 may have a reduced optical power loss and maximized light transmission efficiency.

Each of the first, second, and third refraction layers 797a, 797b, and 797c forming the graded refractive index layer 797 may be formed of one selected from the group consisting of titanium dioxide ($TiO_2$), silicon carbide (SiC), gallium nitride (GaN), gallium phosphide (GaP), silicon nitride (SiN), zirconium dioxide ($ZrO_2$), indium tin oxide (ITO), aluminium nitride (AlN), aluminium oxide ($Al_2O_3$), magnesium oxide (MgO), silicon dioxide ($SiO_2$), calcium fluoride ($CaF_2$), and magnesium fluoride ($MgF_2$).

Figure 10:
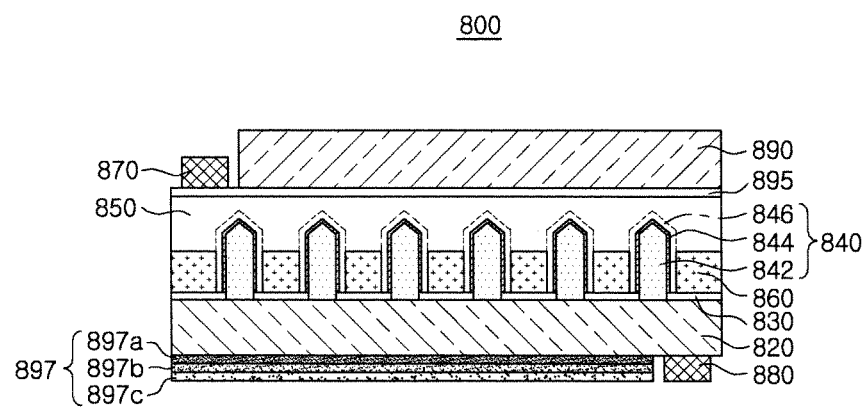

FIG. 10 is a schematic cross-sectional view of a nanostructure semiconductor light-emitting device 800 according to an exemplary embodiment in the present disclosure. Hereinafter, descriptions duplicated with those in FIGS. 1 and 9 will be omitted.

Referring to FIG. 10, the nanostructure semiconductor light-emitting device 800 may include a base layer 820, a first material layer 830, a plurality of light-emitting nanostructures 840, a second conductivity-type semiconductor extension layer 850, a filling layer 860, a reflective metal layer 890, a contact electrode 895, and a graded-refractive index layer 897. Each of the plurality of light-emitting nanostructures 840 may include a nanocore 842, an active layer 844, and a second conductivity-type semiconductor shell layer 846. The graded-refractive index layer 897 may be disposed on a lower surface of the base layer, and include a first refraction layer 897a, a second refraction layer 897b, and a third refraction layer 897c sequentially disposed in a downward direction. Refractive indices of the layers may be downwardly decreased. The nanostructure semiconductor light-emitting device 800 may further include first and second electrodes 870 and 880 electrically connected to the contact electrode 895 and the base layer 820, respectively. In this case, the second electrode 880 may be disposed on a portion of the lower surface of the base layer 820.

Figure 11:
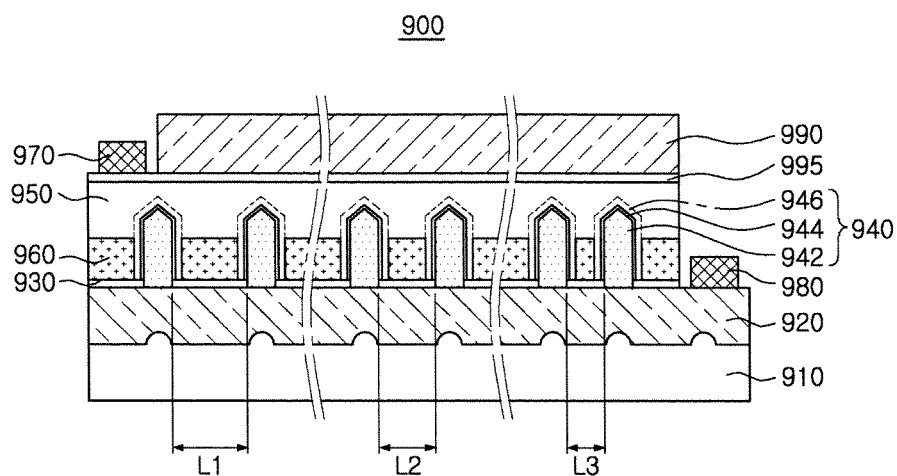

FIG. 11 is a schematic cross-sectional view of a nanostructure semiconductor light-emitting device 900 according to an exemplary embodiment in the present disclosure. Hereinafter, descriptions duplicated with those in FIG. 1 will be omitted.

Referring to FIG. 11, the nanostructure semiconductor light-emitting device 900 may include a growth substrate 910 having protrusions R (refer to FIG. 1), a base layer 920, a first material layer 930, a plurality of light-emitting nanostructures 940, a second conductivity-type semiconductor extension layer 950, a filling layer 960, a reflective metal layer 990, and a contact electrode layer 995. Each of the plurality of light-emitting nanostructures 940 may include a nanocore 942, an active layer 944, and a second conductivity-type semiconductor shell layer 946. The nanostructure semiconductor light-emitting device 900 may further include first and second electrodes 970 and 980 electrically connected to the contact electrode 995 and the base layer 920, respectively.

In the exemplary embodiment, distances between the plurality of openings formed on the first material layer 930 may not be uniform, resulting in non-uniform distances between the plurality of light-emitting nanostructures 940. The greater the distances between the plurality of openings, the relatively greater may be the thicknesses of the active layers 944 grown on the nanocores 942. Due to such differences in thicknesses of the active layers 944, the plurality of light-emitting nanostructures 940 emitting light having different emission wavelengths may be provided, the different emission wavelengths may be combined, and finally the nanostructure semiconductor light-emitting device 900 emitting white light may be provided. In addition, the plurality of light-emitting nanostructures 940 having different emission wavelengths may be obtained by forming the nanocore 942 with different heights and diameters. Referring to FIG. 11, the distances between the plurality of openings may be represented by a first distance L1, a second distances L2, and a third distances L3, and have a relationship of L1>L2>L3.

Figure 13:
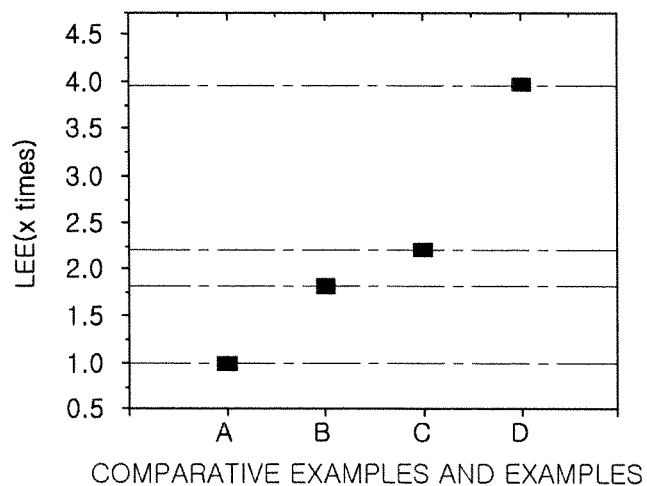
FIG. 13 is a graph illustrating the light extraction efficiency LEE of Example 1, Example 2, Comparative Example 1 and Comparative Example 2.

FIG. 13 is a graph in which relative light extraction efficiencies LEEs of Comparative Example 2 (B), Example 1 (C) and Example 2 (D) are plotted by computer simulation when light extraction efficiency LEE of Comparative Example 1 (A) is assumed as 1.0.

Examples 1 and 2 (C and D) and Comparative Examples 1 and 2 (A and B) have structures as follows.

Example 1

Figure 14:
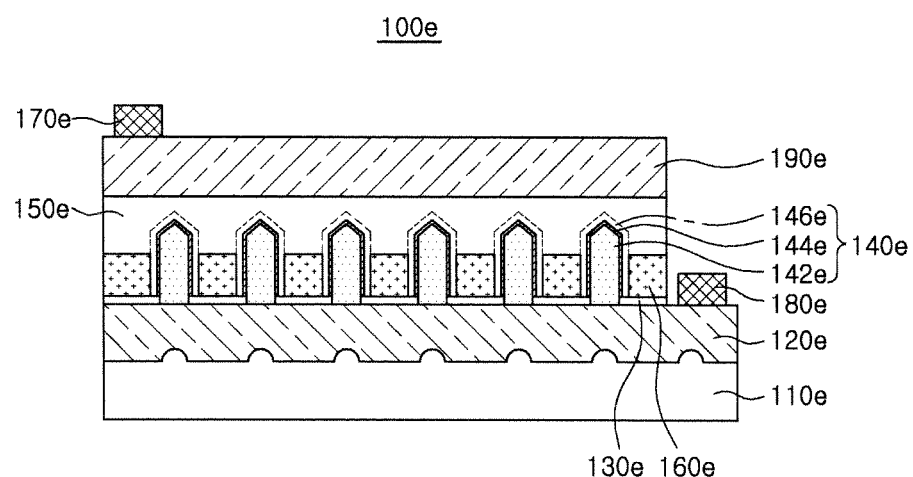
FIG. 14 is a cross-sectional view of a nanostructure semiconductor light-emitting device according to Example 1.

FIG. 14 is a cross-sectional view of a nanostructure semiconductor light-emitting device 100e according to Example 1 (C).

Referring to FIG. 14, the nanostructure semiconductor light-emitting device 100e may include a growth substrate 110e, a base layer 120e, a first material layer 130e, a plurality of light-emitting nanostructures 140e, a second conductivity-type semiconductor extension layer 150e, a filling layer 160e, and a reflective metal layer 190e. Each of the plurality of light-emitting nanostructures 140e may include a nanocore 142e, an active layer 144e, and a second conductivity-type semiconductor shell layer 146e. In addition, the nanostructure semiconductor light-emitting device 100e may include first and second electrodes 170e and 180e electrically connected to the reflective metal layer 190e and the base layers 120e, respectively. The second conductivity-type semiconductor extension layer 150e may be disposed on the filling layer 160e to cover exposed portions of the light-emitting nanostructures 140e. Each of an upper surface of the second conductivity-type semiconductor extension layer 150e and a lower surface of the reflective metal layer 190e is planar.

Example 2

Example 2 (D) is the same as the nanostructure semiconductor light-emitting device 200 illustrated in FIG. 4. More specifically, Example 2 (D) is the same as Example 1 (C), except that a contact electrode 295, an omnidirectional reflector 299, and a reflective metal layer 290 are sequentially formed on the second conductivity-type semiconductor extension layer 295, and portions of the reflective metal layer 290 and omnidirectional reflector 299 are removed such that the contact electrode 295 is directly connected to the first electrode 270.

Comparative Example 1

Comparative Example 1 (A) is the same as Example 1 (C), except that the reflective metal layer is formed directly on the exposed light-emitting nanostructures and filling layer with no second conductivity-type semiconductor extension layer and filling layer.

Comparative Example 2

Comparative Example 2(B) is the same as Example 1 (C), except that a contact electrode layer, an insulating layer having a planar insulating layer, and a reflective metal layer are sequentially formed on the exposed light-emitting nanostructures and filling layer with no second conductivity-type semiconductor extension layer.

Referring to FIG. 13, Comparative Example 2 (B) in which the reflective metal layer has a planar lower surface and is formed to be spaced apart from the light-emitting nanostructures has more improved light extraction efficiency than Comparative Example 1(A) in which the reflective metal layer is formed to directly surround the light-emitting nanostructures. In addition, Example 1(C) in which the second conductivity-type semiconductor extension layer 150e corresponding to each light-emitting nanostructures 140e is connected to each other and a reflective metal layer 190e having a planar lower surface is formed on the second conductivity-type semiconductor extension layer 150e has more improved light extraction efficiency than Comparative Example 2 (B) in which the contact electrode layer is formed directly on a tip of the light-emitting nanostructure and the filling layer. Further, Example 2 (D), which is the same as Example 1 (C) except having additional contact electrode 295 and omnidirectional reflector 299, has more improved light extraction efficiency than Example 1 (C).

Accordingly, the light extraction efficiency may be improved when the reflective metal layer is spaced apart from the light-emitting nanostructures and has a planar surface. In addition, the extraction efficiency may be more improved by adding the omnidirectional reflector.

Figure 15:
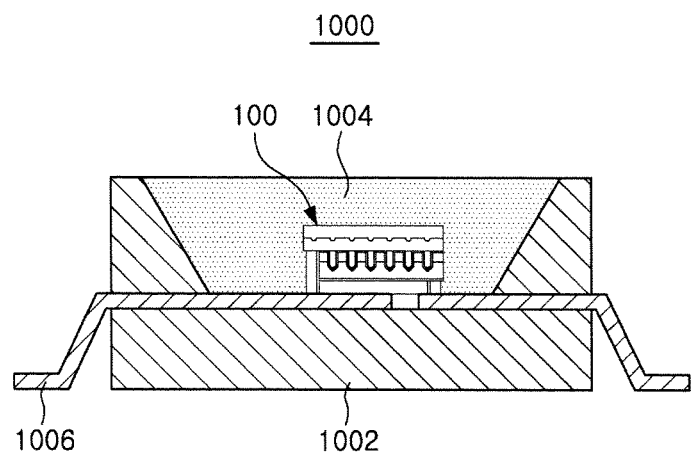
FIGS. 15 and 16 are cross-sectional views illustrating semiconductor light-emitting device packages according to exemplary embodiments in the present disclosure.

FIG. 15 illustrates a semiconductor light-emitting device package 1000 in which the nanostructure semiconductor light-emitting device 100 illustrated in FIG. 1 is mounted in a flip-chip structure.

Referring to FIG. 15, the nanostructure semiconductor light-emitting device 100 may be mounted on a lead frame 1006, and each electrode may be electrically connected to the lead frame 1006. As necessary, the nanostructure semiconductor light-emitting device 100 may be mounted on an area, for example, on a package body 1002, other than the lead frame 1006. In addition, the package body 1002 may have a cup shape in order to improve light reflection efficiency, and an encapsulating material 1004 formed of a light-transmitting material may be formed in such a reflection cup in order to encapsulate the nanostructure semiconductor light-emitting device 100.

Figure 16:
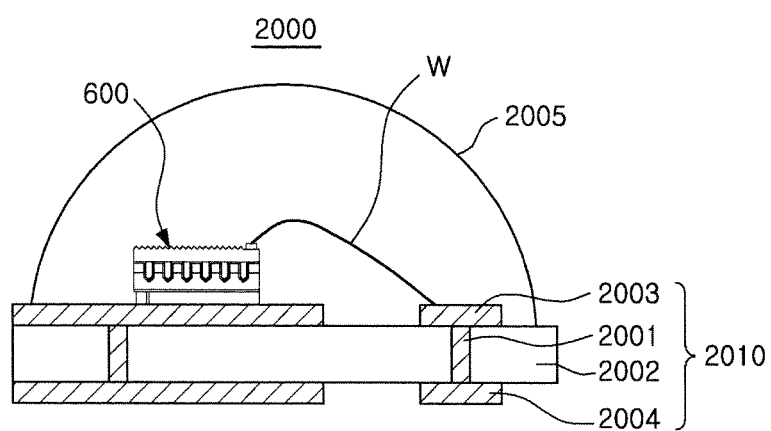

FIG. 16 illustrates a semiconductor light-emitting device package 2000 in which the nanostructure semiconductor light-emitting device 600 illustrated in FIG. 8 is mounted in a flip-chip structure.

Referring to FIG. 16, the nanostructure semiconductor light-emitting device 600 may be mounted on a mounting board 2010 to be electrically connected to the mounting board 2010 through a wire W.

The mounting board 2010 may include a board body 2002, an upper electrode 2003, and a lower electrode 204, and a through via connecting the upper electrode 2003 to the lower electrode 204. The mounting board 2010 may be provided as a substrate, such as a PCB, an MCPCB, an MPCB, and an FPCB. The structure of the mounting board 2010 may be embodied in various forms.

Figure 17:
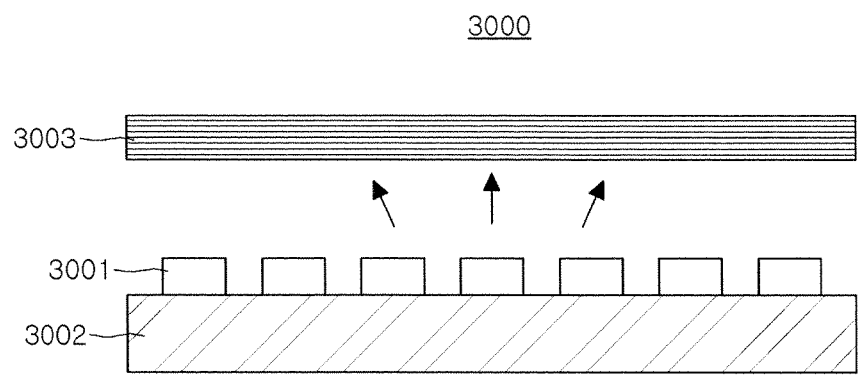
FIGS. 17 and 18 illustrate examples of a backlight unit including a nanostructure semiconductor light-emitting device according to an exemplary embodiment in the present disclosure.
Figure 18:
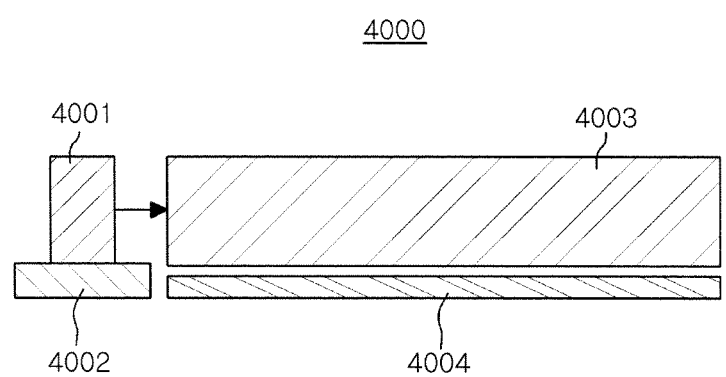

FIGS. 17 and 18 illustrate examples in which a nanostructure semiconductor light-emitting device according to an exemplary embodiment in the present disclosure is applied to a backlight unit.

Referring to FIG. 17, a backlight unit 3000 may include a light source 3001 mounted on a substrate 3002, and one or more optical sheets 3003 disposed on the light source 3001. The light source 3001 may include the above-described nanostructure semiconductor light-emitting device or a package including the nanostructure semiconductor light-emitting device.

The light source 3001 in the backlight unit 3000 illustrated in FIG. 17 emits light toward a top surface where a liquid crystal display (LCD) is disposed. On the contrary, in another backlight unit 4000 illustrated in FIG. 18, a light source 4001 mounted on a substrate 4002 emits light in a lateral direction, and the emitted light may be incident to a light guide plate 4003 and converted to the form of surface light. Light passing through the light guide plate 4003 is emitted upwardly, and a reflective layer 4004 may be disposed on a bottom surface of the light guide plate 4003 to improve light extraction efficiency.

Figure 19:
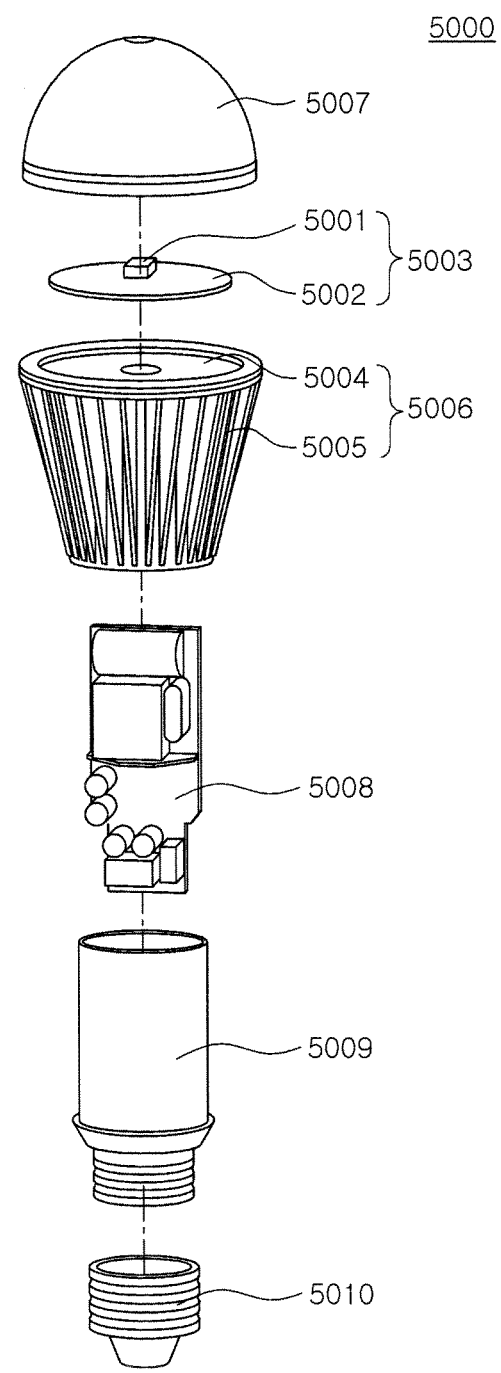
FIG. 19 illustrates an example of an illumination apparatus including a nanostructure semiconductor light-emitting device according to an exemplary embodiment in the present disclosure.

FIG. 19 is an exploded perspective view illustrating an illumination apparatus including a nanostructure semiconductor light-emitting device according to an exemplary embodiment in the present disclosure.

The illumination apparatus 5000 of FIG. 19 is illustrated as a bulb-type lamp as an example, and includes a light-emitting module 5003, a driving unit 5008, and an external connection portion 5010.

In addition, external structures, such as external and internal housings 5006 and 5009 and a cover 5007, may be further included. The light-emitting module 5003 may include a light source 5001, that is, the above-described nanostructure semiconductor light-emitting device or a package including the nanostructure semiconductor light-emitting device, and a circuit board 5002 with the light source 5001 mounted thereon. For example, first and second electrodes of the nanostructure semiconductor light-emitting device may be electrically connected to an electrode pattern of the circuit board 5002. In this exemplary embodiment, a single light source 5001 is mounted on the circuit board 5002, but a plurality of light sources 5001 may be mounted as needed.

The external housing 5006 may function as a heat dissipation unit, and include a heat dissipation plate 5004 in direct contact with the light-emitting module 5003 to enhance a heat dissipation effect, and a heat radiation fin 5005 surrounding a side surface of the illumination apparatus 5000. The cover 5007 may be installed on the light-emitting module 5003, and have a convex lens shape. The driving unit 5008 may be installed in the internal housing 5009 and connected to the external connection portion 5010, such as a socket structure, to receive power from an external power source.

In addition, the driving unit 5008 may function to convert the power to an appropriate current source capable of driving the light source 5001 of the light-emitting module 5003. For example, the driving unit 5008 may be configured as an AC-DC converter, a rectifying circuit component, or the like.

Figure 20:
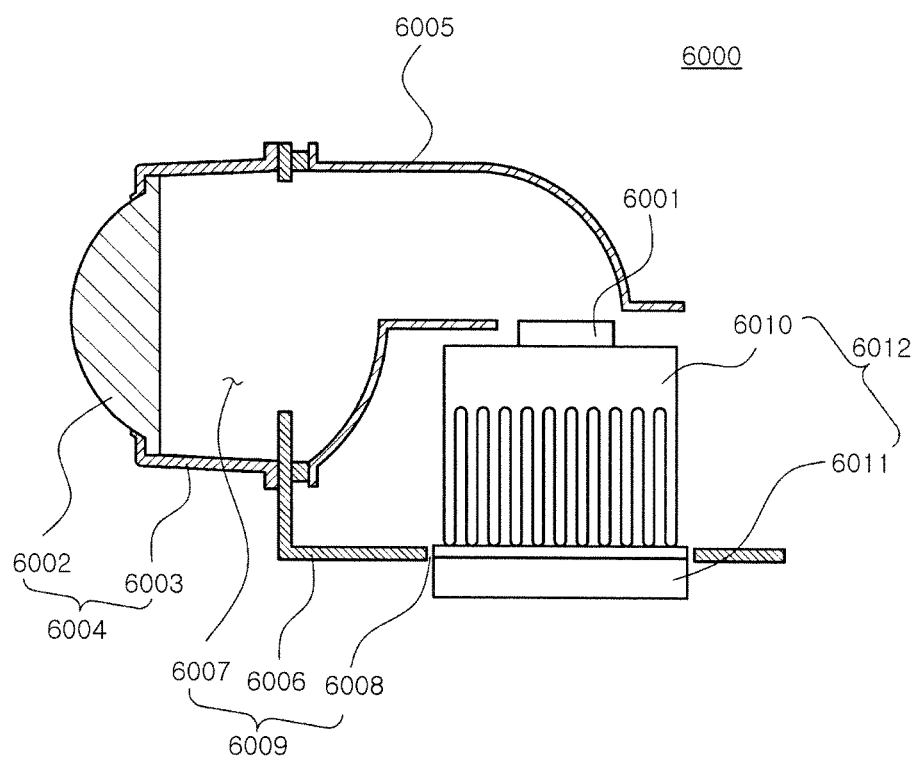
FIG. 20 illustrates an example of a headlamp including a nanostructure semiconductor light-emitting device according to an exemplary embodiment in the present disclosure.

FIG. 20 illustrates an example in which a nanostructure semiconductor light-emitting device according to an exemplary embodiment in the present disclosure is applied to a headlamp.

Referring to FIG. 20, a headlamp 6000 used as a vehicle lamp, or the like, may include a light source 6001, a reflective unit 6005, and a lens cover unit 6004. The lens cover unit 6004 may include a hollow-type guide 6003 and a lens 6002. The light source 6001 may include the above-described nanostructure semiconductor light-emitting device or a package including the nanostructure semiconductor light-emitting device.

The headlamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. In addition, the headlamp 6000 may further include a housing 6009 fixedly supporting the heat dissipation unit 6012 and the reflective unit 6005. The housing 6009 may have a central hole 6008 formed in one surface thereof, in which the heat dissipation unit 6012 is coupledly installed.

The housing 6009 may include a front hole 6007 formed on the other surface integrally connected to the one surface and bent at a right angle. The front hole 6007 may fix the reflective unit 6005 to be disposed over the light source 6001. Accordingly, a front side of the housing 6009 may be open by the reflective unit 6005. The reflective unit 6005 is fixed to the housing 6009 such that the opened front side corresponds to the front hole 6007, and thereby light reflected by the reflective unit 6005 may pass through the front hole 6007 to be emitted outwardly.

As set forth above, in a nanostructure semiconductor light-emitting device according to the exemplary embodiments of the present disclosure, decreases in light extraction efficiency may be suppressed, since light-emitting nanostructures are spaced apart from a contact electrode and thereby a reflection path of light emitted from the light-emitting nanostructures is simplified.

While exemplary embodiments have been shown and described above, it will be apparent to those skilled in the art that modifications and variations could be made without departing from the scope of the present disclosure as defined by the appended claims.

What is claimed is:

1. A nanostructure semiconductor light-emitting device, comprising:
    a base layer formed of a first conductivity-type semiconductor;
    a first material layer disposed on the base layer and including a plurality of openings;
    a plurality of light-emitting nanostructures, each of which extends through each of the plurality of openings and includes a nanocore formed of a first conductivity-type semiconductor, an active layer and a second conductivity-type semiconductor shell layer, sequentially disposed on the nanocore;
    a filling layer disposed on the first material layer, wherein the filling layer fills spaces between the plurality of light-emitting nanostructures and a portion of each of the plurality of light-emitting nanostructures is exposed by the filling layer;
    a second conductivity-type semiconductor extension layer disposed on the filling layer and covering the exposed portion of each of the plurality of light-emitting nanostructures; and
    a contact electrode layer disposed on the second conductivity-type semiconductor extension layer.

2. The nanostructure semiconductor light-emitting device of claim 1, wherein each of the plurality of light-emitting nanostructures comprises a body having a first crystal plane and a tip having a second crystal plane different from the first crystal plane.

3. The nanostructure semiconductor light-emitting device of claim 2, wherein the exposed portion of each of the plurality of light-emitting nanostructures includes at least the tip of each of the plurality of light-emitting nanostructures.

4. The nanostructure semiconductor light-emitting device of claim 2, wherein a height of the filling layer is greater than about 50% of a height of the body of each of the plurality of light-emitting nanostructures.

5. The nanostructure semiconductor light-emitting device of claim 1, further comprising a reflective metal layer disposed on the contact electrode layer.

6. The nanostructure semiconductor light-emitting device of claim 5, wherein a lower surface of the reflective metal layer is planar.

7. The nanostructure semiconductor light-emitting device of claim 1, further comprising an omnidirectional reflector disposed on the contact electrode layer.

8. The nanostructure semiconductor light-emitting device of claim 7, wherein an upper surface of the second conductivity-type semiconductor extension layer is not planar and an upper surface of the omnidirectional reflector is formed according to a shape of the upper surface of the second conductivity-type semiconductor extension layer.

9. The nanostructure semiconductor light-emitting device of claim 7, wherein the omnidirectional reflector includes first and second refraction layers having different refractive indices.

10. The nanostructure semiconductor light-emitting device of claim 1, wherein portions of the second conductivity-type semiconductor extension layer corresponding to each of the plurality of light-emitting nanostructures are connected to each other.

11. The nanostructure semiconductor light-emitting device of claim 10, wherein an upper surface of the second conductivity-type semiconductor extension layer is planar.

12. The nanostructure semiconductor light-emitting device of claim 1, further comprising:
    a first electrode disposed on a portion of an upper surface of the contact electrode layer;
    and a second electrode disposed on a portion of one of an upper surface and a lower surface of the base layer.

13. The nanostructure semiconductor light-emitting device of claim 1, wherein a plurality of protrusions are formed on a lower surface of the base layer.

14. The nanostructure semiconductor light-emitting device of claim 1, further comprising a graded refractive index layer disposed on a lower surface of the base layer, wherein the graded refractive index layer comprises a plurality of layers having refractive indices gradually decreasing away from the lower surface of the base layer.

15. The nanostructure semiconductor light-emitting device of claim 1, further comprising a growth substrate disposed on the base layer, wherein an upper surface of the growth substrate has a plurality of protrusions.

16. The nanostructure semiconductor light-emitting device of claim 1, wherein the contact electrode layer is in direct contact with the filling layer.

17. A nanostructure semiconductor light-emitting device, comprising:
    a base layer formed of a first conductivity-type semiconductor;
    a first material layer disposed on the base layer and including a plurality of openings;
    a plurality of nanostructures extending through each of the plurality of openings, wherein each of the plurality of nanostructures includes a nanocore formed of a first conductivity-type semiconductor and an active layer disposed on the nanocore;

a second conductivity-type semiconductor layer including a plurality of shell layers, each of which surrounds each of the plurality of nanostructures, and an extension layer connecting each of the plurality of shell layers; and a contact electrode layer disposed on the second conductivity-type semiconductor layer.

18. A nanostructure semiconductor light-emitting device, comprising:

a base layer formed of a first conductivity-type semiconductor;

a first material layer disposed on the base layer and including a plurality of openings;

a plurality of light-emitting nanostructures protruding from the base layer and extending through the plurality of openings;

a filling layer disposed on the first material layer and filling spaces between the plurality of light-emitting nanostructures, a portion of each of the plurality of light-emitting nanostructures exposed by the filling layer;

a second conductivity-type semiconductor extension layer disposed on the filling layer and covering the exposed portion of each of the plurality of light-emitting nanostructures, an upper surface of the second conductivity-type semiconductor extension layer being uneven; and a contact electrode layer disposed on the second conductivity-type semiconductor extension layer.

19. The nanostructure semiconductor light-emitting device of claim 18, wherein the upper surface of the second conductivity-type semiconductor extension layer at an area over the plurality of light-emitting nanostructures has a level higher than that of an area excluding the area over the plurality of light-emitting nanostructures.

20. The nanostructure semiconductor light-emitting device of claim 18, further comprising an omnidirectional reflector disposed on the contact electrode layer.

* * * * *